United States Patent
Capeleto et al.

(10) Patent No.: US 8,482,928 B2
(45) Date of Patent: Jul. 9, 2013

(54) METHOD OF CONNECTING PRINTED CIRCUIT BOARDS AND CORRESPONDING ARRANGEMENT

(75) Inventors: Simone Capeleto, Padua (IT); Christian Hacker, Rejensburg (DE)

(73) Assignee: Osram Gesellschaft Mit Beschrankter Haftung, Munich (DE)

( * ) Notice: Subject to any disclaimer, the term of this patent is extended or adjusted under 35 U.S.C. 154(b) by 387 days.

(21) Appl. No.: 12/587,978

(22) Filed: Oct. 15, 2009

(65) Prior Publication Data

US 2010/0099276 A1    Apr. 22, 2010

(30) Foreign Application Priority Data

Oct. 16, 2008    (EP) ..................................... 08166750

(51) Int. Cl.
*H05K 1/00*    (2006.01)
*H05K 1/14*    (2006.01)

(52) U.S. Cl.
CPC ..................................... *H05K 1/148* (2013.01)
USPC ......................................... 361/749; 174/260

(58) Field of Classification Search
CPC ....... H05K 1/148; H05K 3/0061; H05K 3/361; H05K 2201/09027
USPC . 361/749, 785, 769, 760, 791; 174/250–260; 257/678; 439/791, 857; 29/830
See application file for complete search history.

(56) References Cited

U.S. PATENT DOCUMENTS

| | | | |
|---|---|---|---|
| 3,579,206 A | 5/1971 | Grange | |
| 5,422,900 A * | 6/1995 | Reele et al. | 372/29.01 |
| 5,742,484 A | 4/1998 | Gillette et al. | |
| 5,777,855 A * | 7/1998 | Yokajty | 361/803 |
| 6,784,375 B2 | 8/2004 | Miyake et al. | |
| 6,867,668 B1 | 3/2005 | Dagostino et al. | |
| 7,336,139 B2 | 2/2008 | Blair et al. | |
| 2002/0189862 A1 | 12/2002 | Miyake et al. | |
| 2007/0040626 A1 * | 2/2007 | Blair et al. | 333/1 |
| 2007/0290307 A1 * | 12/2007 | Lin | 257/678 |
| 2009/0097242 A1 * | 4/2009 | Hsieh et al. | 362/234 |
| 2009/0244871 A1 * | 10/2009 | Lin | 361/791 |

OTHER PUBLICATIONS

Chinese Office Action dated Feb. 16, 2013 (and English translation thereof) in counterpart Chinese Application No. 200910205683.3.

* cited by examiner

*Primary Examiner* — Yuriy Semenenko
(74) *Attorney, Agent, or Firm* — Holtz, Holtz, Goodman & Chick, P.C.

(57) ABSTRACT

Connecting a first (12) and a second (14) printed circuit board or PCB carrying a LED lighting source (10) and the associated drive circuitry involves providing board connection pads (12a, 14a) at said first (12) and second (14) PCBs, and arranging a flex PCB (16) in a bridge-like fashion between the first (12) and second (14) PCBs. The flex PCB (16) has connection pads (16a) for bonding with the board connection pads (12a, 14a) of the PCBs (12, 14). The connection pads (16a) in the flex PCB (16) arranged in a bridge-like fashion between the first (12) and second (14) PCBs are bonded with the connection pads (12a, 14a) of the first (12) and second (14) PCBs, so that the first (12) and second (14) PCBs are connected.

16 Claims, 1 Drawing Sheet

METHOD OF CONNECTING PRINTED CIRCUIT BOARDS AND CORRESPONDING ARRANGEMENT

FIELD OF THE INVENTION

This disclosure relates to connecting Printed Circuit Boards (briefly, PCBs).

This disclosure was devised with specific attention paid to its possible use in PCB mounting arrangements for lighting sources such as light-emitting diode (LED) lighting sources.

DESCRIPTION OF THE RELATED ART

Electrical connection between different PCBs is a critical point in production.

For instance, in the case of LED modules, the LED or LEDs (i.e. the light sources) and the related driver electronics are frequently mounted on different PCBs (oftentimes referred to as the LED-PCB and the DRIVER-PCB). This may be the result of e.g. the LED or LEDs being already mounted on a PCB of their own and/or the requirement of thermally insulating the driver electronics from the heat-source represented by the LED or LEDS. Also, the driver electronics may be bulky and the mounting space available in the vicinity of the LED or LEDs may not be sufficient.

With such a configuration, connection between the two (or more) PCBs involved may be critical. In fact, automatically soldering wires between the PCBs may be far from easy, while mechanical connectors are usually bulky and may represent an undue additional cost. More generally, connection may be labour- and time-consuming and lends itself poorly to up-scaling in the presence of higher production volumes.

OBJECT AND SUMMARY OF THE INVENTION

In designing LED modules, use of LEDs already mounted on respective PCBs may sometimes be avoided (for instance, plastic packages or ceramic submounts may be preferred).

Also, if using LEDs already mounted on a PCB of their own cannot be avoided, efforts may be made at optimizing the connection process of the LED-PCB to the driver-PCB.

While in that way the critical nature of connection between PCBs may be somehow palliated, the need is still felt for improved solutions which may radically dispense with the disadvantages discussed previously.

The object of the invention is to provide such a solution.

According to the invention, that object is achieved by means of a method as set forth in the claims that follow. The invention also relates to a corresponding arrangement.

The claims are an integral part of the disclosure of the arrangement described herein.

BRIEF DESCRIPTION OF THE ANNEXED REPRESENTATIONS

Figure 1:
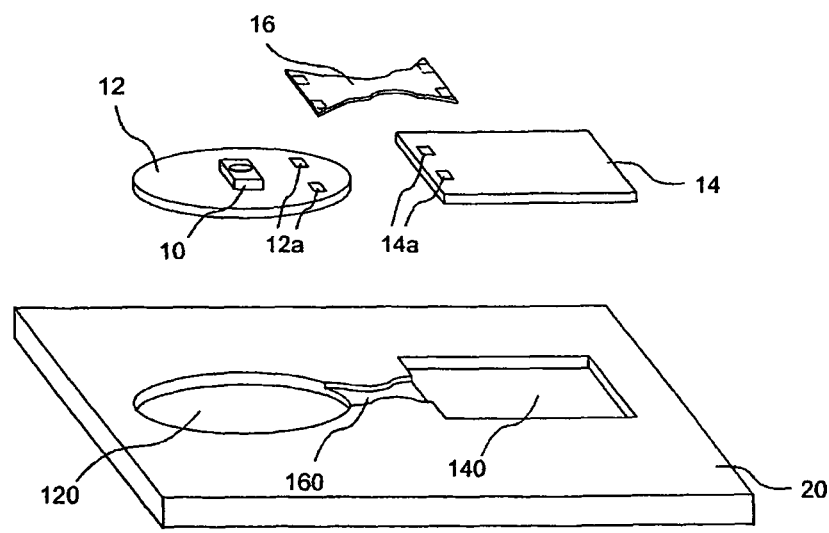
Figure 2:
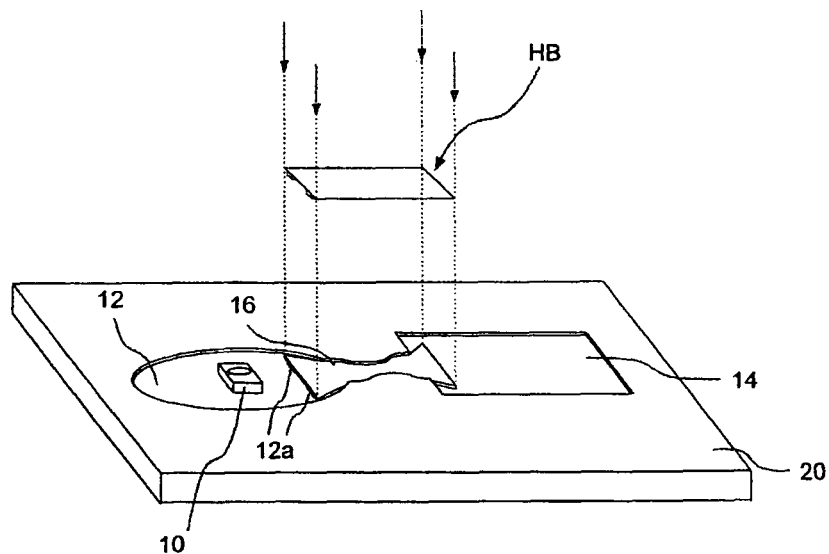

The invention will now be described, by way of example only, with reference to the annexed representations, wherein:

FIG. 1 is an exploded perspective view of the parts involved in an arrangement as described herein, and FIG. 2 represents the operation of connecting the various parts shown in FIG. 1.

DETAILED DESCRIPTION OF EMBODIMENTS

In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

In FIG. 1, reference 10 denotes a LED light source (including one or more LEDs) mounted on a printed circuit board (PCB) 12. The PCB 12 is intended to be connected with another PCB 14 carrying thereon driver electronics for the LED light source 10. The two PCBs 12 and 14 are provided with connection pads 12a, 14a to enable electrical connection therebetween.

Unless otherwise detailed in the following, these parts and elements are conventional in the art, which makes it unnecessary to provide a more detailed description herein.

Reference 16 denotes as whole a so-called "flex" PCB (namely, a flexible PCB o FCB) carrying respective connection lines as well as pads 16a to be soldered to the pads 12a, 14a of the PCBs 10 and 14 to ensure electrical connection therebetween.

In the embodiment shown, the pads 12a, 14a of the PCBs 12 and 14 face "upwardly" while the connection pads 16b of the flex 16 face downwardly. The flex 16 can thus be arranged in a bridge-like arrangement above and across the PCBs 10 and 14 while bonding (e.g. soldering) of the pads 12a, respectively 14a with the pads 16a of the flex 16. This result—can be achieved—in a known manner—by means of a hot bar HB which is temporally superposed to the flex 16 (or at least the ends thereof) to produce soldering of the pads 12a, 14a and 16a.

For facilitating the soldering process, the pads 12a and 14a can be partially left uncovered by the flex allowing the direct contact between the hot bar HB and the metal pads.

The bonding process can be also carried out by means of laser soldering techniques. In that case the pads 12a and 14a may be left partially uncovered in order to allow the laser beam to reach the soldering area.

A "flex" is a well known component adapted for connecting electrical/electronic components expected to move mutually during operation (e.g. in hard disk drives) and/or components of apparatus whose mutual positions are changed during assembly of the apparatus.

In the embodiment shown, connecting the PCBs 12, 14 via the flex involves a base plate 20.

In the embodiment shown, the metal plate 20 includes three recessed areas 120, 140 and 160.

These recesses can be easily produced when manufacturing the plate 20 and are intended to house:
  the PCB 12 (recess 120),
  the PCB 14 (recess 140); and
  the "flex" 16 (recess 160).

In the embodiment shown, the recesses 120, 140 and 160 are generally "shallow" recesses having thicknesses substantially equal to the "height" or "depth" of the element intended to be received therein.

As a result of this (and as better appreciated in FIG. 2) the PCBs 12 and 14 may be arranged in the recesses 100, 140 and the flex 16 arranged in a bridge-like arrangement therebetween in such a way that the upper surface of the flex 16 lies at least approximately "flush" with the upper surface of the plate 20.

In that way, when the hot bar HB or the soldering laser is applied, the flex 16 (or at least the ends of the flex 16) are very precisely positioned, with the pads 16a exactly facing and abutting against the pads 12a, 14a. The desired bonding action may be achieved in a rapid and reliable manner by minimising the amount of the heat energy applied.

The arrangement described herein completely dispenses with the need of using wires and/or mechanical connectors and is ideally adapted for an automated soldering process. The fixed shape of the flex 16 derives from the layout design, related cut and mechanical properties while the flat bonding pads (12a, 14a, 16a) provide a wide contact surface thus facilitating an automated bonding process. The bonding process may be automated by resorting to simple machinery (essentially a metal base properly shaped and a movable hot bar or laser soldering head).

The layout of the flex PCB 16 can be selected to match the relative expected positions of the two PCBs 12 and 14 in the final application. Exact positioning on the three components involved in the connection process (12, 14 and 16, in the drawings herein) permits the hot bar HB (or the laser soldering beam) to move in correspondence with the pads to be soldered and apply the thermal profile required for the bonding process. Manual work is completely dispensed with in the production of lighting modules since no manual soldering is being resorted to thus giving rise to a completely automated process. No additional components are introduced by rendering the production process a very fast one. Also, the arrangement described herein lends itself to a semi-automatic implementation in the case of small volumes to be produced.

Of course, without prejudice to the underlying principles of the invention, the details and embodiments may vary, even significantly, with respect to what has been described and illustrated by way of example only, without departing from the scope of the invention as defined by the annexed claims. For instance, the method described in the foregoing can be extended to connecting more than two PCBs. Also, at least one of the PCBs involved may already include a flexible part providing the bridge-like function (i.e. the flex PCB).

The invention claimed is:

1. An arrangement comprising:
   a support structure;
   a first printed circuit board (PCB);
   a second printed circuit board (PCB);
   board connection pads provided on both of said first and second PCBs; and
   a flex PCB arranged so as to bridge between said first and second PCBs, said flex PCB having connection pads in facing opposition with and bonded with said board connection pads so as to provide electrical and physical connection between said first and second PCBs;
   wherein said support structure includes:
   a first recess in which first PCB is receivable;
   a second recess in which said second PCB is receivable; and
   a third recess in which said flex PCB is receivable, said third recess having a depth such that said flex PCB is substantially flush to an outer surface of said support structure when said flex PCB is received therein.

2. The arrangement of claim 1, wherein said support structure is heat conductive.

3. The arrangement of claim 1, wherein said flex PCB is a flexible integral part of at least one of said first and second printed circuit boards.

4. The arrangement of claim 1, wherein a light-emitting diode (LED) lighting source is provided on said first PCB, and drive circuitry for driving said LED lighting source is provided on said second PCB.

5. The arrangement of claim 1, wherein said board connection pads of said first and second PCBs face upwardly so as to face respective connection pads of said flex PCB facing downwardly to abut against said board connection pads.

6. The arrangement of claim 1, wherein said flex PCB is substantially planar, and said connection pads are exposed on both surface sides of said flex PCB.

7. A method to make the arrangement of claim 1, the method including:
   arranging said flex PCB so as to bridge between said first and second PCBs, said flex PCB having said connection pads in facing opposition with said board connection pads for bonding with said board connection pads, and
   bonding said connection pads of said flex PCB with said board connection pads, thereby electrically connecting said first and second PCBs.

8. The method of claim 7, wherein said first and second PCBs are respectively provided with an LED lighting source and drive circuitry for said LED lighting source.

9. The method of claim 7 or 8, wherein said support structure is provided at least during said bonding.

10. The method of claim 9, wherein said support structure is a support plate.

11. The method of claim 9, wherein said support structure is heat conductive.

12. The method of claim 9, further including arranging said first and second PCBs with said board connection pads facing upwardly and arranging said flex PCB with the respective connection pads facing downwardly against said board connection pads.

13. The method of claim 9, wherein said bonding includes soldering said board connection pads with the connection pads in said flex PCB.

14. The method of claim 9, wherein said bonding includes controlled application of at least one of heat and laser radiation to said board connection pads and said connection pads in said flex PCB.

15. The method of claim 9, wherein said board connection pads are provided on each of said first and second PCBs.

16. The method of claim 9, the method being applicable to connect more than two PCBs.

* * * * *